United States Patent [19]

Steidlitz

[11] 4,069,497
[45] Jan. 17, 1978

[54] HIGH HEAT DISSIPATION MOUNTING FOR SOLID STATE DEVICES AND CIRCUITS

[75] Inventor: Mark Steidlitz, Cherry Hill, N.J.

[73] Assignee: EMC Technology, Inc., Cherry Hill, N.J.

[21] Appl. No.: 604,349

[22] Filed: Aug. 13, 1975

[51] Int. Cl.² .................... H01L 23/28; H01L 23/42; H01L 39/02; H01L 23/02
[52] U.S. Cl. .............................. 357/80; 357/72; 357/79; 357/81
[58] Field of Search ................ 357/72, 79, 80, 81

[56] References Cited

U.S. PATENT DOCUMENTS

| 3,513,362 | 5/1970 | Yamamoto | 357/81 |
| 3,764,507 | 10/1973 | McKinnon et al. | 357/80 |
| 3,801,874 | 4/1974 | Stefani | 357/81 |
| 3,801,882 | 4/1974 | Ward | 357/81 |
| 3,902,148 | 8/1975 | Drees et al. | 357/72 |

Primary Examiner—Edward J. Wojciechowicz
Attorney, Agent, or Firm—Hubbell, Cohen, Stiefel & Gross

[57] ABSTRACT

A solid state device or circuit mounted or printed on a heat conductive ceramic substrate such as beryllia is brought into thermal conductive relation with a metal heat dissipation plate as by clamping with no intervening materials such as an adhesive or solder therebetween.

14 Claims, 8 Drawing Figures

HIGH HEAT DISSIPATION MOUNTING FOR SOLID STATE DEVICES AND CIRCUITS

BACKGROUND OF THE INVENTION

1. Field of the Invention

This invention relates to solid state devices and circuits and particularly to solid state devices and circuits capable of handling relatively large amounts of power. Most particularly, this invention relates to a new and improved method and apparatus for mounting a solid state device or circuit to heat dissipation plate such as ground plane for greatly increasing the amount of heat dissipation achieved to thereby render the device or circuit capable of handling increased amounts of power.

2. The Prior Art

Heretofore, to increase the heat dissipation of solid state devices and circuits, it has been known to affix to the bottom of a heat conductive substrate supporting the device or circuit a metal stud which serves as a heat sink. Generally, the stud is connected to a metal plate underlying the conductive ceramic and the plate is connected to the conductive ceramic substrate as by an epoxy glue or solder. Both the metal plate and the metal stud are included to dissipate heat generated in the conductive or semi-conductive film on the ceramic substrate. Such devices have not been overly efficient principally because, interposed between the metal base plate and the conductive ceramic is a layer of so-called thermally conductive epoxy glue or solder which is in fact, notwithstanding the thinness of the layer, substantially resistant to thermal conduction. Thus, the layer greatly reduces the heat dissipation. Similar problems may also be encountered between the metal plate and the metal stud depending therefrom.

A good discussion of the prior art and of certain so-called improvements thereto may be found in U.S. Pat. No. 3,513,362 granted to Isamu Yamamoto on May 19, 1970. In said Yamamoto patent, three varieties of prior art arrangements for improving the heat dissipation of semi-conductive devices are illustrated and then Yamamoto in FIGS. 4 through 6 of said patent illustrates three embodiments at his improvements over the prior art. The prior art shown in FIGS. 1 through 3 of the Yamamoto patent all show a solid state device 10 connected in some manner or other to an end portion which, in FIGS. 1 and 2 of Yamamoto, are of smaller cross section and which in FIG. 3 is of greater diameter and are respectively designated by the reference characters 12' and 22. In each of the assemblies shown in FIGS. 1 through 3, the heat to be dissipated is generated in the semiconductive device 10, the heat being dissipated principally through the end portions 12 and 22. However, it will be obvious that the end portions 12 and 22 are secured to the semi-conductive device 10 in the typical manner heretofore known, namely, by a suitable adhesive or solder which in the past has significantly reduced the capability of such assemblies to dissipate large amounts of heat energy. It is for that reason that none of the prior art arrangements shown in FIGS. 1 through 3 of Yamamoto have been altogether successful in solving have problem of heat dissipation. Thus, the power rating of devices and circuits using the teachings of FIGS. 1 to 3 have been sharply limited. from the ceramic plate to the support block. To dissipate heat from the support block, the 16.

Similarly, in FIGS. 4 to 6 of Yamamoto, Yamamoto's solution to the prior art problems is shown. In Yamamoto, the semiconductor device is mounted on a ceramic substrate which in turn is affixed to a circular support block. While Yamamoto does not expressly disclose the manner in which the substrate is connected to the support block, it is apparent that he could only hve done this in the manner of the prior art, namely, by an intervening adhesive or solder layer which greatly interferes with the conduction of heat from the support block, the block is secured to an underlying heat dissipation plate 16 by a clamp welded to the plate 26. However, heat generated in the semiconductor device 10 must still get into the support block 22 and this requires it to pass through the insulating layer of epoxy or solder. Thus, it remains difficult to dissipate heat generated in the semiconductor 10.

SUMMARY OF THE INVENTION

A solid state device such as a semi-conductor device, integrated circuit or resistor or the like includes a conductive ceramic substrate, preferably beryllia, on which conductive films or semi-conductive films are deposited. Preferably, the lower surface of the ceramic substrate is lapped as is the confronting surface of a thermally conductive backing plate, such as, for example, a ground plane in stripline or microstrip circuitry or a can for containing an integrated circuit chip or a transistor or the like. Holding the two surfaces in surface-to-surface relationship is a clamp which may be held in clamping relation by screws or the like. It is important to the present invention that there is no intervening adhesive or solder layer between the surfaces as it is this intervening layer which greatly reduces the conduction of heat away from the device.

DETAILED DESCRIPTION OF THE PREFERRED EMBODIMENTS

Figure 1:
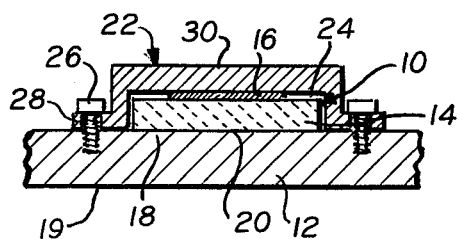
FIG. 1 is a vertical sectional view of a solid state device held down by a clamp in accordance with the present invention.
Figure 2:
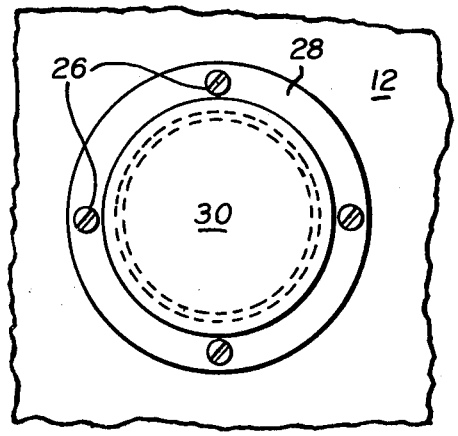
FIG. 2 is a top plane view thereof.

Referring now to the drawing in detail, and particularly to FIGS. 1 and 2 thereof, a solid state device 10 is shown mounted on a thermally conductive heat dissipation plate 12. The device 10 is mounted on the heat dissipation plate 12 in such a manner that there is no thermal barrier interposed between the solid state device 10 and the heat dissipation plate 12. More particularly, the nature of the mounting preferably eliminates the use of adhesive or solder layers and relies more heavily on surface-to-surface contact as may be effected by the use of a mechanical clamp holding the device against the heat dissipation plate. The solid state device 10 may be of any type of solid state device, including, for example, and not by way of limitation, a power transistor or a resistive load, especially a thin film resistive load serving as a termination for a microwave transmission line. In addition, the solid state device may be an array of circuit elements and interconnecting conductors commonly termed an integrated circuit. Thus, the device 10 may be what is commonly called a circuit "chip". Irrespective of the nature of the device 10, it includes an electrically insulating substrate 14 and a conductive or semi-conductive layer 16 on one surface thereof. It is desirable that the conductive or semiconductive layer 16 be fixed to the upper surface of the substrate 14 without the interposition of any thermal barrier. Thus, preferably, the layer 16 will not be held on the upper surface of the substrate 14 by an adhesive or solder film or layer in the preferred form of the invention. Instead, a method for depositing the conductive or semi-conductive layer 16 directly onto the upper surface of the substrate 14 is preferred. For example, in the presently preferred form of the invention, the layer 16 is deposited on the substrate 14 by such a method as vapor deposition, flame spraying, sputtering, screen printing of conductive glaze, plasma spraying or any similar technique which yields a direct application of the conductive or semiconductive layer onto the substrate 14. This insures good conduction of heat away from layer 16 toward the opposite surface of the substrate. Suitable electrical terminals (not shown) are connected to portions of the conductive layer 16 as is well known to those skilled in the art. Preferably, the substrate 14 is made of a thermally conductive material with beryllia ceramic being the presently preferred substrate material due to its excellent electrical insulating properties coupled with its very high thermal conductivity.

The heat dissipation plate 22 is preferably made of metal, such as aluminum, and may be the chassis on which a variety of solid state devices 10 are mounted or it may be a cylindrical container or "can" in which the device 10 is enclosed or it may merely be a plate included to dissipate heat. Irrespective of the nature of the plate 12, it will be obvious that plate 12 should have good thermal conductivity and preferably good thermal radiation characteristics as would come from a blackened surface. It will be recognized that notwithstanding the fact that the segment of the plate 12 shown in FIG. 1 appears to be flat, it could be a portion of an arcuate container without departing from the present invention.

In accordance with the present invention as demonstrated in FIGS. 1 and 2, the surface of the beryllia substrate 14 remote from the conductive or semi-conductive layer 16, that is the surface 18, is preferably shaped as by lapping, for example, to conform precisely to the confronting surface 20 of the plate 12. Clearly, if the plate 12 is flat, then the surfaces 18 and 20 will be flat, whereas if the plate 12 is cylindrical, then the surfaces 18 and 20 will be shaped in an arcuate configuration. However, lapping of the surfaces is preferred as it enables excellent surface-to-surface contact between the thermally conductive substrate 14 and the thermally conductive plate 12 which serves as a heat sink.

While the essence of the invention is the use of surface-to-surface contact between the substrate 14 and the conductive plate 12 to improve heat dissipation, it should be understood that this invention is not to be negated by the use in said surface-to-surface contact joint of conductive greases or the like which improve thermal conduction through the interstitial voids that are inevitably present in surface-to-surface contact. Thus, for example, a variety of conductive greases and the like could be employed at the joint between the bottom surface of the substrate 14 and the confronting surface of the heat dissipation plate 12 without departing from this invention.

To hold the two surfaces 18 and 20 in thermally conductive relationship which results from close confrontation thereof, in accordance with the present invention a clamp 22 is provided. As shown in FIGS. 1 and 2, the clamp 22 is a flanged circular disc provided with a central cavity 24 which is complementary to the shape of the solid state device 10 so that it may be received therewithin. However, it is preferred that the vertical extent of the solid state device is slightly greater than the vertical extent of the cavity 24 so that when the clamp 22 is clamped to the plate 12 as by driving screws 26 or other suitable securing elements through the outer flange 28 of the clamp, the horizontal central portion 30 of the clamp will come into tight relationship with the upper portion of the solid state device 10 and force it downwardly. Thus, the surfaces 18 and 20 will be held tightly against one another. While it is not shown, it will be obvious and is preferred that if clamp 22 is electrically conductive some form of electrical insulating covering should overlie the upper surface of the solid state device 10 to prevent any interference with its operation which might flow from direct engagement of the clamp 22 therewith.

It will be obvious that other means for holding clamp 22 in clamping relation other than screws 26, such as rivets may be employed without departing from this invention.

Given the physical arrangement of the assembly of FIGS. 1 and 2, it will be seen that heat generated by current flow in film 16 will be readily conducted downwardly through the thermally conductive substrate 14 and thence to the heat sink 12 which will provide a large area for heat dissipation on its outer surface. The efficacy of the assembly stems from the elimination of any insulating joint, such as a solder or glue joint between the heat generating film 16 and the heat dissipating surface 19, something that is invariably found in the prior art known to applicant.

Figure 3:
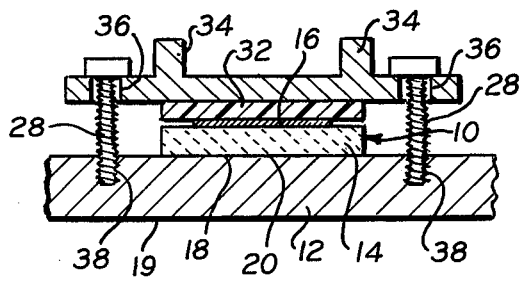
FIG. 3 is a view similar to FIG. 1 showing a modified form of clamp.
Figure 4:
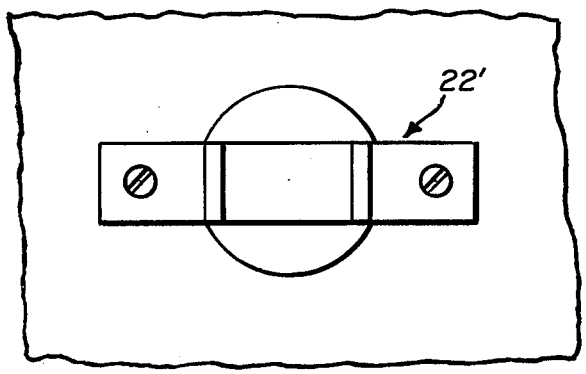
FIG. 4 is a top plane view of the modification of FIG. 3.

Referring now to the embodiment shown in FIGS. 3 and 4 of the present invention, the solid state device may be of any of the types hereinbefore mentioned. The device is therefore designated by the reference character 10. The device 10 is shown to have a ceramic substrate 14, which ceramic preferably exhibits both good electrical insulating properties and high thermal conductivity such as, for example, beryllia. Overlying the upper surface of the beryllia substrate 14 is a layer of conductive or semi-conductive material 16. As shown in the embodiments of FIGS. 3 and 4, overlying the conductive or semi-conductive layer 16 is a layer of an electrically insulating material which acts as a protective pad. As shown, the pad is preferably made of plastic such as, for example, polytetrafluoroethylene, although numerous other plastics may be employed. The plastic pad is designated by the reference numeral 32. As may best be seen in FIG. 4, the clamp 22' of the FIG. 3, 4 embodiment does not overlie and surround the solid state device 10. Instead, the device 22' is a strap of rigid material such as aluminum or the like, which material may have some upstanding reinforcing ribs 34 if desired.

The longitudinal extent of the strap is greater than the diameter of the solid state device 10 and is provided with a pair of through holes 36 which register with underlying tapped holes 38 in the heat dissipation plate 12 which may be of any of the types previously mentioned. Extending through the holes 36 and into threaded engagement with the holes 38 are a pair of clamping screws 28 for clamping the solid state device 10 against the heat dissipation plate 12. Preferably, the surfaces 18 and 20 of the substrate 14 and the plate 12, respectively, have been shaped to ensure good heat transfer therebetween.

Figure 5:
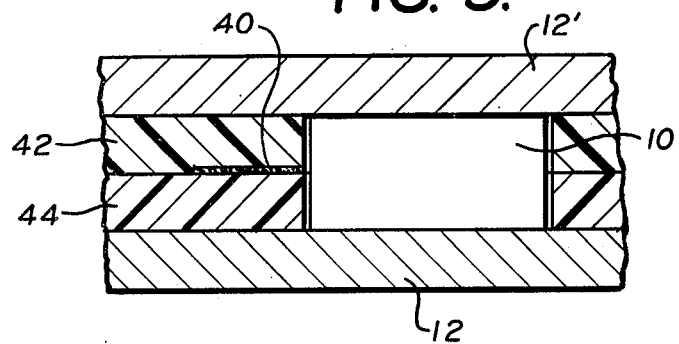
FIG. 5 is a vertical sectional view of a portion of a stripline circuit in which a solid state device is mounted in accordance with the present invention.

Referring now to FIG. 5, it will be seen from a study of this drawing that the invention need not be practiced through the intervention of a specific clamp 22 or 22' as illustrated in the FIGS. 1 and 3 embodiments. The invention may be employed in connection with stripline circuitry as shown in FIG. 5 or, as will be obvious to the person skilled in the art, with microstrip circuitry. In stripline circuitry, the exterior of the stripline assembly is defined by two conductive ground planes 12 and 12', both or either of which may serve as the heat dissipation plate 12 of the earlier described embodiments. A suitable solid state device 10 is shown in surface-to-surface engagement with the two metal ground planes 12 and 12' with the lead in terminal 40 of the device 10 in engagement with a conductive strip printed on one or both of the insulating plates 42 and 44 sandwiched between the ground planes. All of this is well known to the skilled art worker. In accordance with the present invention, the device 10 is constructed so that one of the ground planes 12 or 12' is in surface-to-surface relation with the thermally conductive substrate 14 therein, which substrate may or may not be electrically conductive depending upon the nature of the device 10. However, care must be taken that the device 10 is constructed so that that portion thereof which generates heat is in direct engagement with the thermally conductive substrate which in turn will be in direct thermally conductive relation with the underlying ground plane 12 or 12'.

Figure 6:
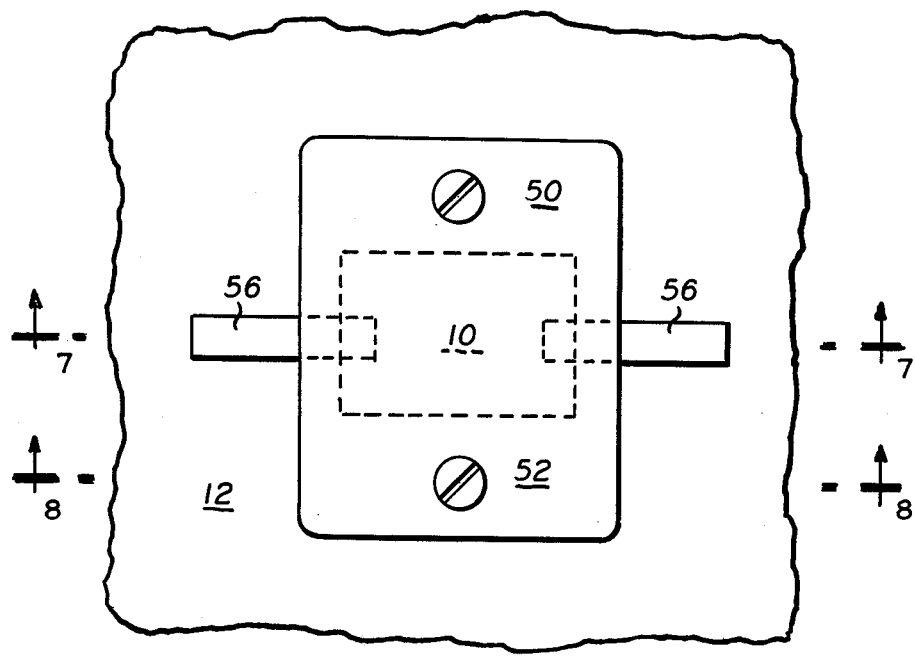
FIG. 6 is a top plan view of a solid state device clamped to a heat dissipation plate by the presently preferred means for doing so.
Figure 7:
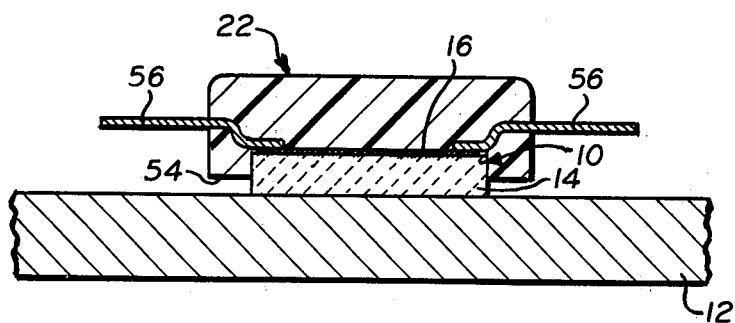
FIG. 7 is a sectional view taken along the line 7—7 in FIG. 6.
Figure 8:
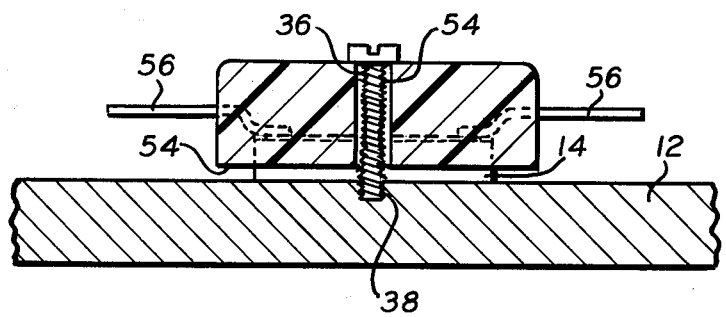
FIG. 8 is a sectional view taken along the line 8—8 in FIG. 6.

The presently preferred form of the invention is illustrated in FIGS. 6 through 8 wherein the clamp 22 is molded, as for example, by transfer or injection molding, about the device 10 by any suitable form of plastic such as, for example, silicone, epoxy, or ABS plastic. At present a mineral filled silicone as sold by Dow Chemical Co. under its number 306 is preferred.

The clamp 22 is dimensioned relative to the solid state device 10 so that there are marginal areas 50 and 52 which can be provided, either by molding or subsequent drilling with apertures 54 through which hold down securing elements, such as, for example, screws 36 may pass to threadedly engage registered tapped holes 38 in the heat dissipation plate 12 so that when the screws are secured the lower surface of the substrate 14 is in surface-to-surface engagement with the upper surface of the heat dissipation 12. Of course, if desired a conductive grease may be included in said joint. To this end it should be noted that the bottom surface of the molded clamp 22 of FIGs. 6 through 8, that is the surface 54, does not extend down to the bottom surface of the substrate 14, but terminates somewhat short of that bottom surface plane. This insures that the molded clamp 22 does not interfere with the surface-to-surface contact between the substrate 14 and the heat dissipation plate 12.

While good mechanical interlocking can be achieved between the molded clamp 22 and the device 10 by providing in the peripheral side wall of the substrate 14 suitable grooves or protrusions, this is not necessary in most instances due to the inclusion in the solid state devices 10 of suitable terminals 56 which are in electrical conducting relation with the conductive or semiconductive film 16. Terminals 56 provide suitable mechanical interlocking between the device 10 and the molded clamp 22.

It will be obvious to anyone skilled in the art of molding that in making the molded integral plastic article of FIGS. 6 through 8, the solid state device 10 including its terminals 56 will serve as an insert in a mold cavity into which the plastic making up clamp 22 is injected. It will also be obvious to the skilled art worker that a good match of thermal expansion coefficients is desirable between the device 10 and the clamp 22.

Irrespective of the arrangement employed, it will be seen that an excellent thermally conductive path is provided for the solid state devices 10 of the various embodiments shown herein, which path includes only thermally conductive materials with no interposed nonconducting films such as are commonly encountered in the prior art in the form of adhesive films or solder films or the like. The high thermally conductive path provided by the present invention permits the heat generating portion of the solid state device to generate considerably larger quantities of heat than has been heretofore possible without any increase in the temperature of the device owing to the significant increase in the ability of the device to dissipate heat through the low thermal resistance path from the device 10 to the dissipation plate 12 and then using the large area of the plate 12 for thermal dissipation. Thus, the power handling capability of device 10 is greatly improved.

While I have herein shown and described the preferred form of the present invention and have suggested modifications therein, other changes and modifications may be made therein within the scope of the appended claims without departing from the spirit and scope of this invention.

What I claim is:

1. An electronic assembly for enabling enhanced dissipation of heat from a heat generating portion of a solid state device, said assembly comprising said solid state device; a heat dissipation plate supplied externally to said solid state device; and means for mechanically clamping said solid state device to said externally supplied heat dissipation plate; said solid state device comprising an electrically insulating thermally conductive substrate and a current carrying film layer disposed directly on one surface of said substrate without the interposition of any thermal barrier therebetween, said current carrying film layer generating heat as a result of current flow therein; said mechanical clamping means mechanically clamping said solid state device to said externally supplied heat dissipation plate in direct thermally conductive bearing relationship between the thermally conductive substrate surface which is opposite to said one surface and said externally supplied heat dissipation plate for providing a direct thermally conductive heat dissipation path for heat generated in said current carrying layer to said thermally conductive substrate and therethrough to said externally supplied heat dissipation plate for thermal dissipation of said generated heat throughout said heat dissipation plate surface area.

2. The electronic assembly of claim 1, wherein said substrate is made of beryllia and the heat dissipation plate is made of metal.

3. The electronic assembly of claim 1, wherein the surfaces of said substrate and said plate in direct thermally conductive bearing relationship are lapped surfaces.

4. The electronic assembly of claim 2, wherein the surfaces of said substrate and said plate in direct thermally conductive bearing relationship are lapped surfaces.

5. The electronic assembly of claim 2, wherein said plate is a portion of an enclosure for said device.

6. The electronic assembly of claim 2, wherein said plate is a supporting chassis for said device.

7. The electronic assembly of claim 1, wherein said device is in a stripline circuit and said plate is a ground plane for said circuit.

8. The electronic assembly of claim 1, wherein said clamping means is a molded plastic body enveloping said one surface of said substrate and a portion of the peripheral side wall thereof adjacent said one surface, the surface of said substrate opposite to said one surface being free of said plastic body and being exposed.

9. The electronic assembly of claim 1, wherein said clamping means is a flanged disc having a recess receiving said solid state device therein, and screws extending through said flange and connecting said disc to said plate.

10. The electronic assembly of claim 1, wherein said clamping means is a rigid strap of greater longitudinal extent than said device overlying said device with end portions extending therebeyond, and screws extending through said end portions and connecting said strap to said plate.

11. The electronic assembly of claim 1, wherein said clamping means is a molded plastic body enveloping said one surface of said substrate and a portion of the peripheral side wall thereof adjacent said one surface, the surface of said substrate opposite to said one surface being free of said clamp and being exposed.

12. The electronic assembly of claim 11, said molded plastic body extending along said peripheral side wall a distance less than the distance between said one surface and said opposite surface of said substrate.

13. The electronic assembly of claim 8, wherein said molded plastic body extends along said peripheral side wall a distance less than the distance between said one surface and said opposite surface of said substrate.

14. The electronic assembly of claim 13, wherein said securing means are a pair of screw holes through said plastic body.

* * * * *